United States Patent
Lin et al.

(10) Patent No.: US 7,628,615 B2
(45) Date of Patent: Dec. 8, 2009

(54) ELECTRICAL CONNECTOR ASSEMBLY HAVING IMPROVED PICK UP CAP

(75) Inventors: Nan-Hung Lin, Tu-cheng (TW); Fang-Chu Liao, Tu-cheng (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 12/229,348

(22) Filed: Aug. 21, 2008

(65) Prior Publication Data
US 2009/0053909 A1    Feb. 26, 2009

(30) Foreign Application Priority Data
Aug. 21, 2007    (CN) .................. 2007 2 0045423

(51) Int. Cl.
*H01R 13/60* (2006.01)
(52) U.S. Cl. .................. 439/41; 439/135; 439/940
(58) Field of Classification Search ............ 439/41, 439/135, 342, 940
See application file for complete search history.

(56) References Cited
U.S. PATENT DOCUMENTS

| | | | |
|---|---|---|---|
| 6,626,691 B2 * | 9/2003 | Yu | 439/342 |
| 6,945,799 B2 * | 9/2005 | Huang | 439/135 |
| 7,140,890 B1 * | 11/2006 | Ju | 439/135 |
| 7,367,822 B2 * | 5/2008 | Ma | 439/135 |
| 2007/0155205 A1 * | 7/2007 | Harper, Jr. | 439/135 |
| 2008/0146044 A1 * | 6/2008 | Liao | 439/41 |

* cited by examiner

*Primary Examiner*—Hae Moon Hyeon
(74) *Attorney, Agent, or Firm*—Andrew C. Cheng; Wei Te Chung; Ming Chieh Chang

(57) ABSTRACT

An electrical connector assembly (1) includes an electrical connector (5) and a pick up cap (2) fixed on the electrical connector (5). The electrical connector (5) comprises an insulative housing (3) and a plurality of contacts (4) received therein. The insulative housing (3) comprises a bottom wall (31) and sidewalls (32) extending upwardly from the bottom wall (31). The sidewall (32) includes a spring arm (33) extending along the sidewall (32) and the spring arm (33) is provided with a locking portion (331). The pick up cap (2) comprises a body portion (21) and a retention portion (22) extending downwardly from the body portion (21). The retention portion (22) is interlocked with the locking portion (331) for securely positioning the pick up cap (2) on the electrical connector (5).

15 Claims, 6 Drawing Sheets

ELECTRICAL CONNECTOR ASSEMBLY HAVING IMPROVED PICK UP CAP

BACKGROUND OF THE INVENTION

1. Field of the Invention

The present invention relates to an electrical connector assembly which comprises an electrical connector and a pick up cap, and particularly to an electrical connector assembly comprises an electrical connector and an improved pick up cap that securely be positioned on the electrical connector.

2. Description of the Prior Art

On many production lines, electronic components such as land grid array (LGA) connectors are accurately positioned on substrate circuits such as printed circuit boards (PCBs) by means of vacuum suction devices. Such an LGA connector typically comprises an insulative housing, a plurality of electrical contacts received in the housing. Each contact has a first contact portion protruding outwardly from a top portion of the housing, for electrically connecting with a multiplicity of metal contact pads of an LGA central processing unit (CPU) respectively. Thus, a pick up cap has to be pre-attached on the top portion of the housing. The pick up cap typically has a plurality of latches snapping corresponding sidewalls of the housing, thereby mounting the pick up cap onto the LGA connector. The pick up cap has a smooth flat top surface. The vacuum suction device is then able to engage on the flat top surface of the pick up cap, in order to reliably move and accurately position the LGA connector onto the PCB The pick up cap with latches always has a worse molding character, the latches then are easy to rupture, thus make the pick up cap can not be fixed on the electrical connector normally, which make it hard to assemble the electrical connector to the PCB.

In view of the above, a new electrical connector which overcomes the above-mentioned disadvantages is desired.

SUMMARY OF THE INVENTION

Accordingly, an object of the present invention is to provide an electrical connector assembly which comprises an electrical connector and an improved pick up cap securely be positioned on the electrical connector.

To achieve the above-mentioned object, an electrical connector assembly in accordance with a preferred embodiment of the present invention, comprises an electrical connector and a pick up cap fixed on the electrical connector. The electrical connector is used for electrically connecting an electronic package with a circuit substrate and comprises an insulative housing and a plurality of contacts received therein. The insulative housing comprises a bottom wall and sidewalls extending upwardly from the bottom wall. The sidewall includes a spring arm extending along the sidewall and the spring arm defines a locking portion. The pick up cap comprises a body portion and a retention portion extending downwardly from the body portion. The retention portion is interlocked with the locking portion for securely positioning the pick up cap on the electrical connector.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
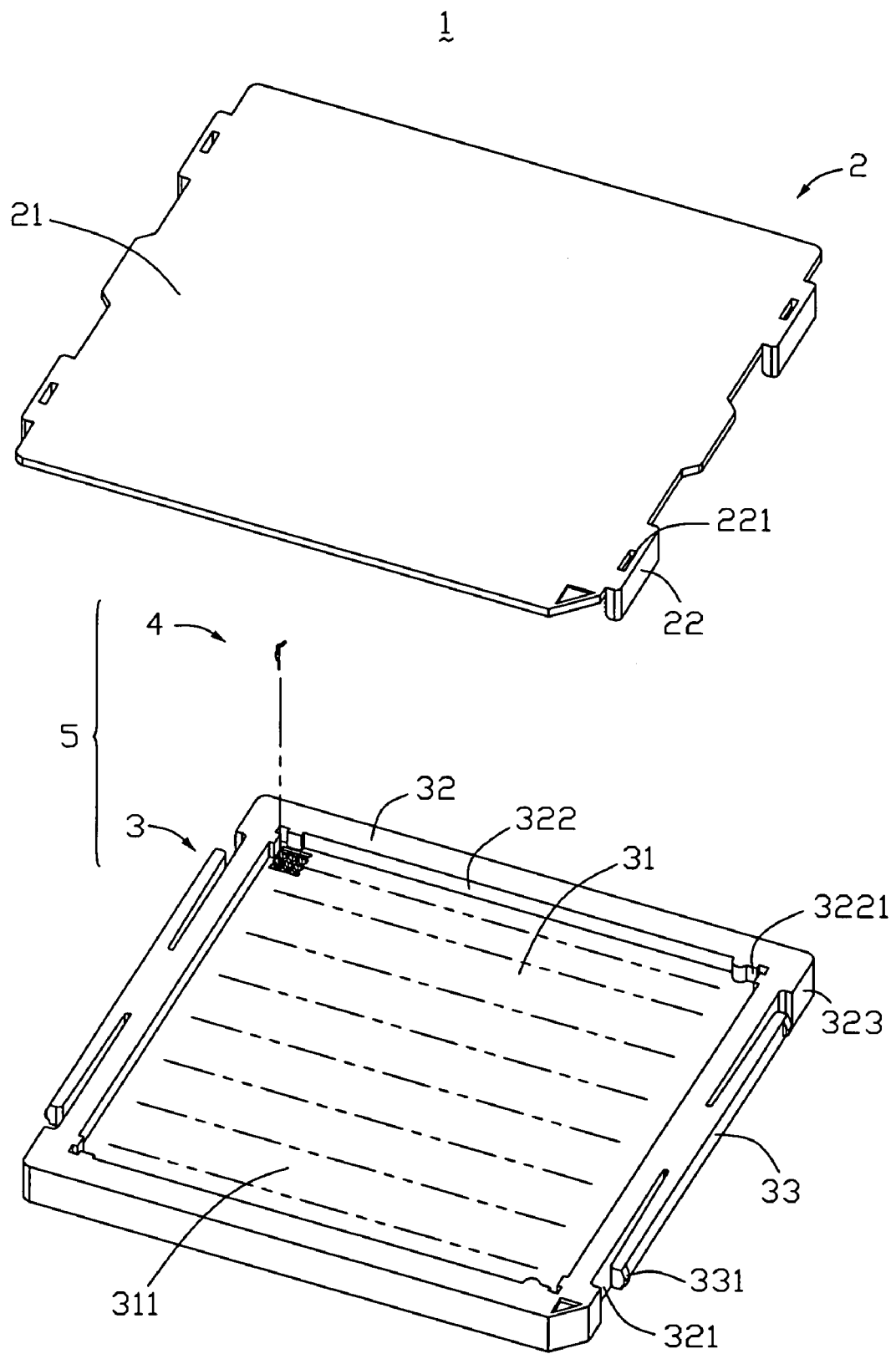
FIG. 1 is an exploded, isometric view of an electrical connector assembly in accordance with the embodiment of the present invention.
Figure 2:
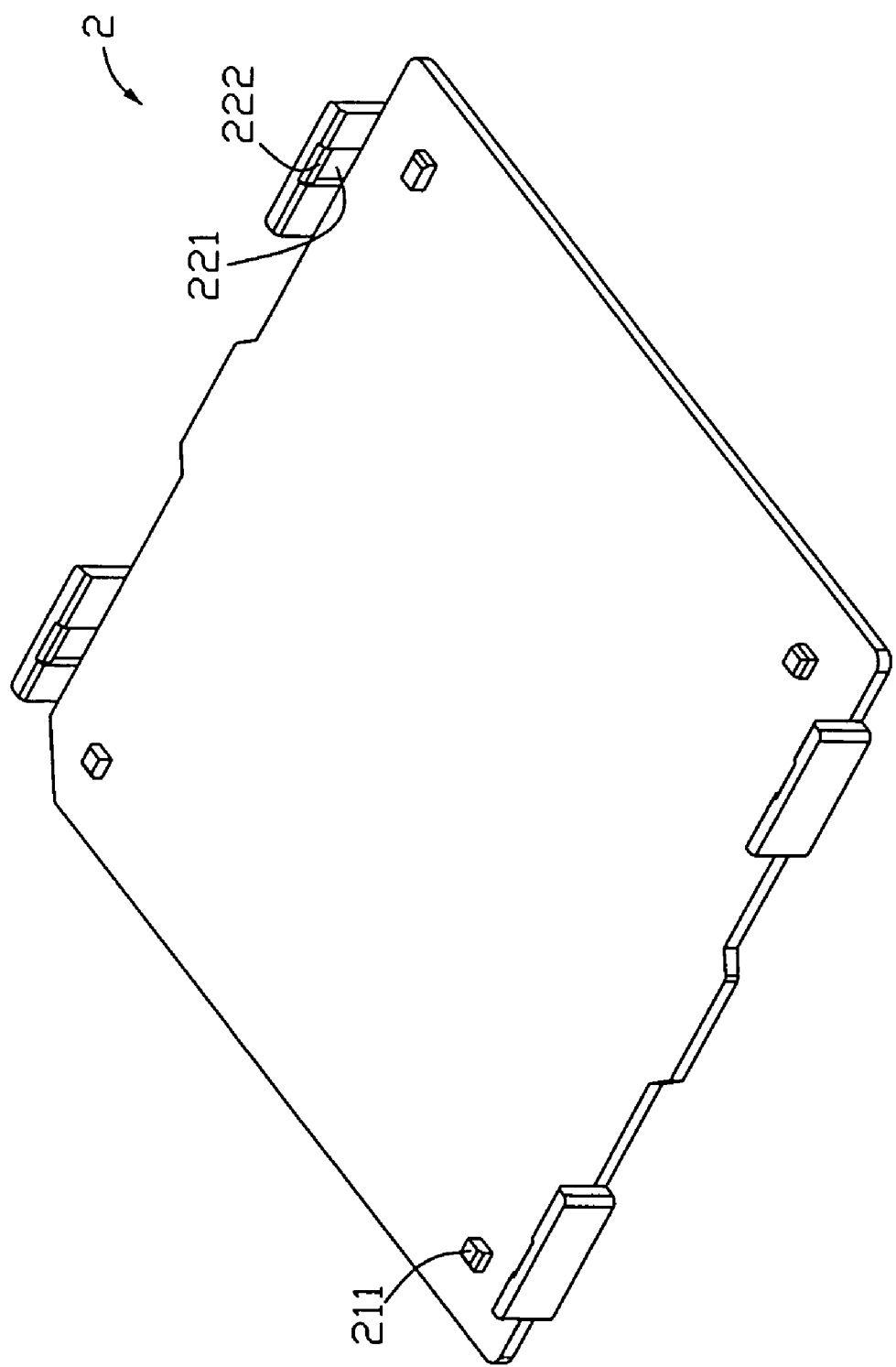
FIG. 2 is an isometric view of the pick up cap of the electrical connector assembly of FIG. 1.
Figure 3:
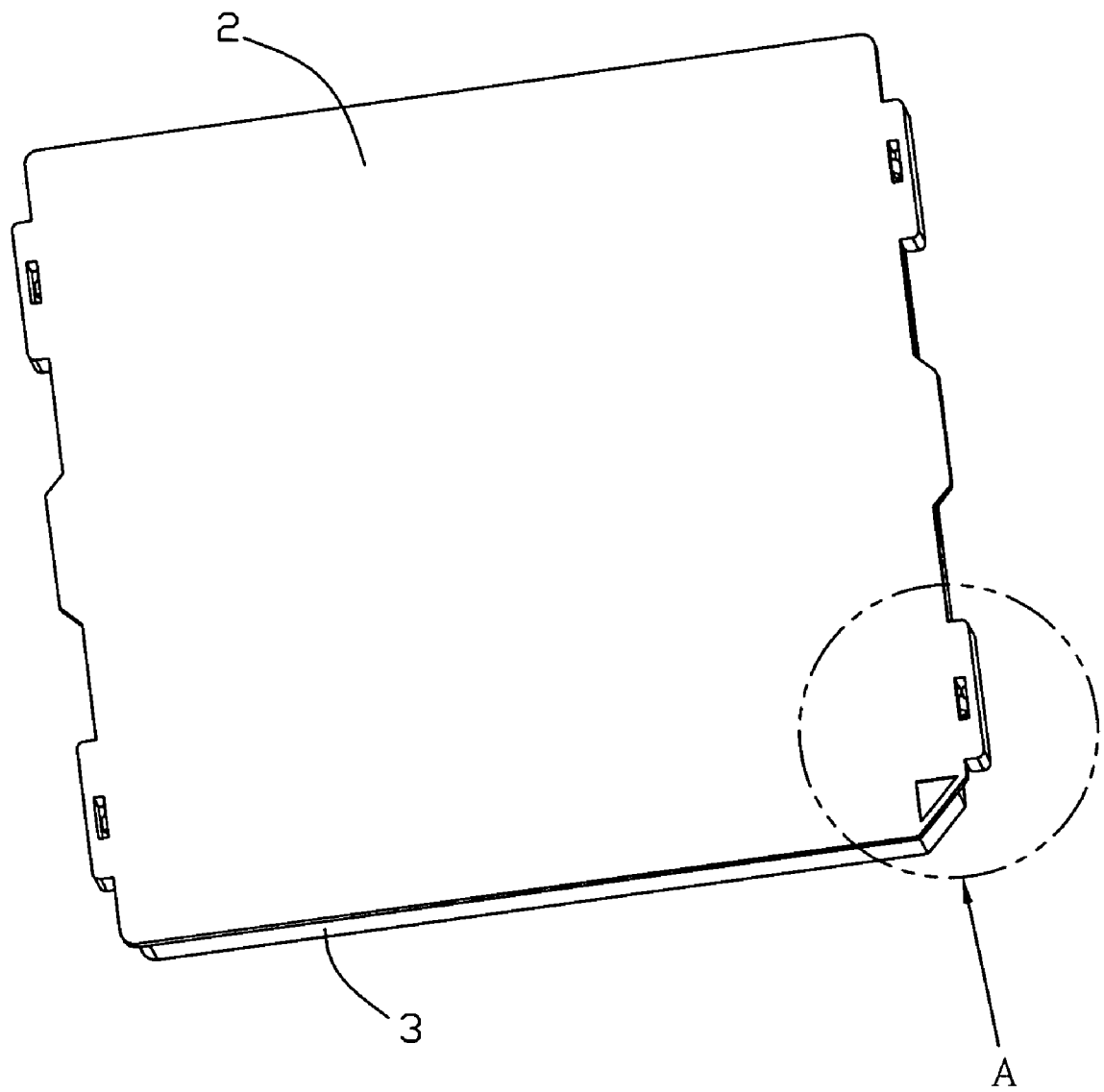
FIG. 3 is an assembled view of the electrical connector assembly of FIG. 1.

Referring to FIGS. 1-2, an electrical connector assembly 1 in accordance with a preferred embodiment of the present invention, comprises an electrical connector 5 and a pick up cap 2 fixed on the electrical connector 5.

Figure 4:
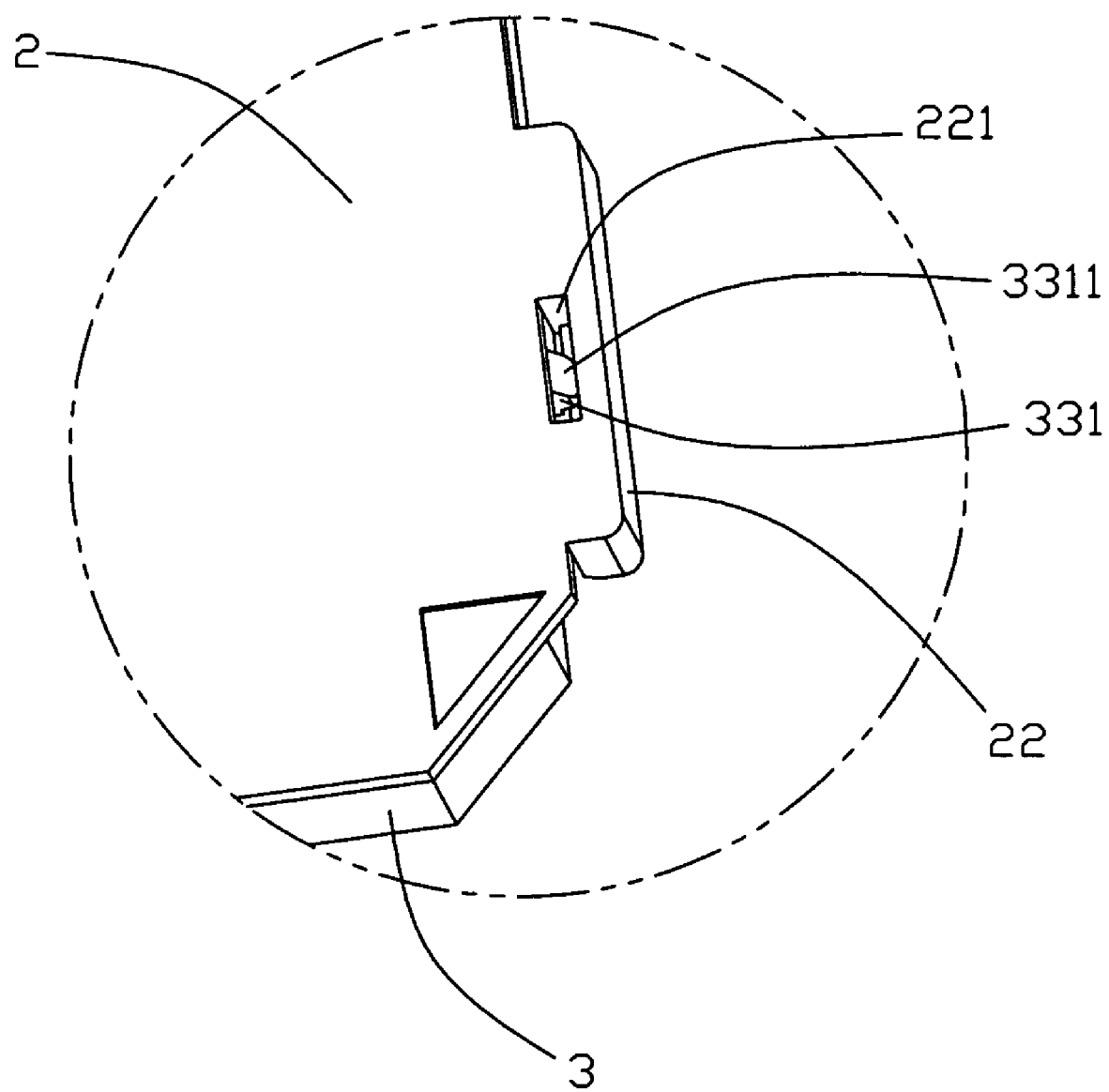
FIG. 4 is an enlarged view of the part labeled A of FIG. 3.
Figure 5:
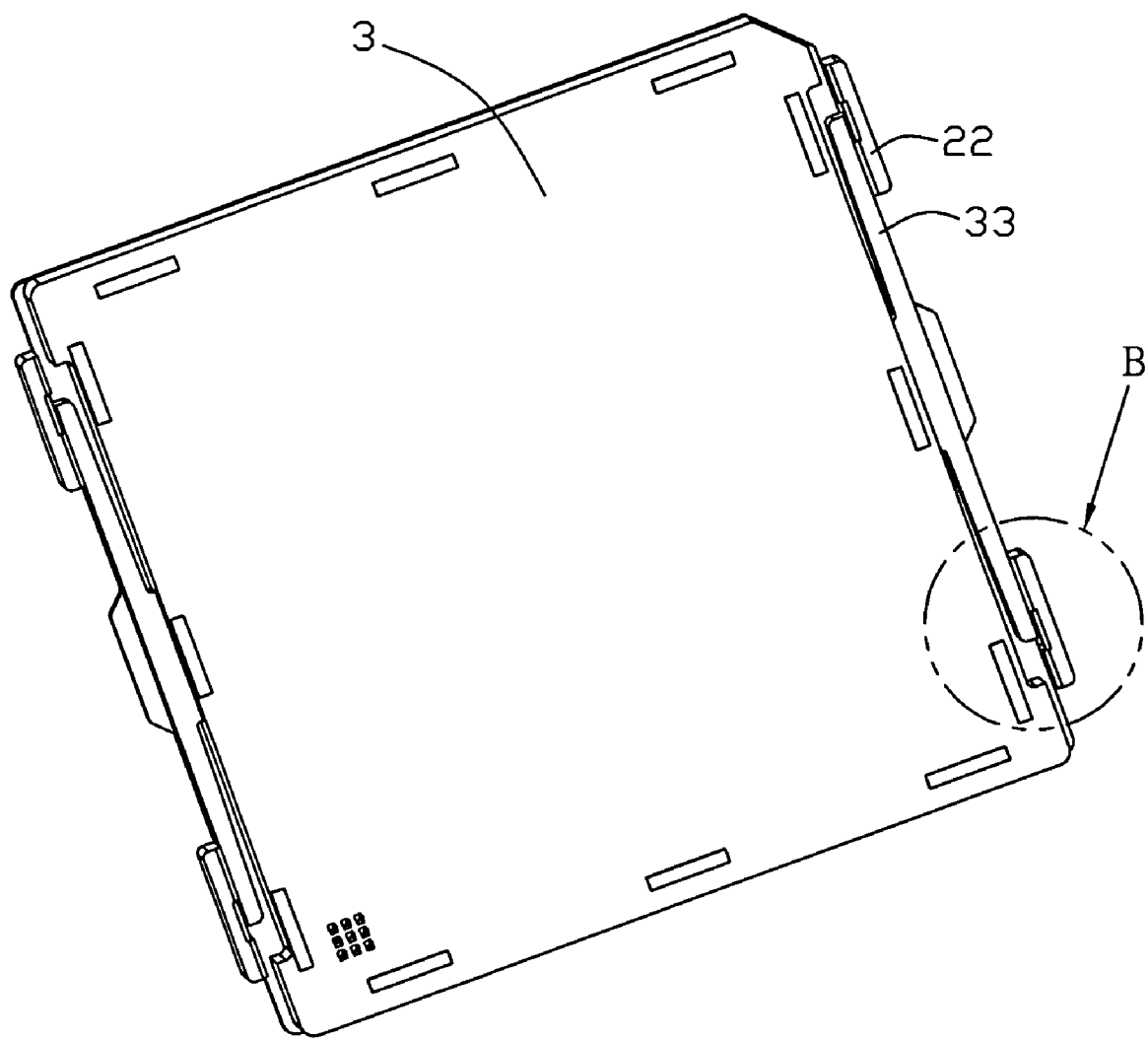
FIG. 5 is an inverted view of the electrical connector assembly of FIG. 3.

The electrical connector 5 is used for electrically connecting an electronic package (not shown) with a circuit substrate (not shown) and comprises an insulative housing 3 and a plurality of contacts 4 received therein. The insulative housing 3 comprises a flat bottom wall 31, a number of sidewalls 32 extending upwardly from the bottom wall 31 and a receiving cavity 311 formed by the bottom wall 31 and the sidewalls 32. The receiving cavity 311 faces upwardly. The sidewall 32 comprises an inner wall 322 near the receiving cavity 311 and an outer wall 323 opposite to the inner wall 322. The inner wall 322 defines a number of first protruding members 3221 extending into the receiving cavity 311 and at least an outer wall 323 defines a recess 321 with a spring arm 33 connected with the surface of the recess 321 at a middle portion thereof. In this embodiment of the resent invention, there are two pairs of spring arms 33 located on opposite sides of the periphery of the insulative housing 3. The recess 321 is longer than the spring arm 33 and the spring arm 33 is partly positioned in the recess 321 at the transverse direction. The spring arm 33 extends essentially along a horizontal direction and includes a pair of locking portions 331 extending outwardly at two ends thereof. Please referring to FIG 4, the locking portion 331 defines a first guiding surface 3311.

Figure 6:
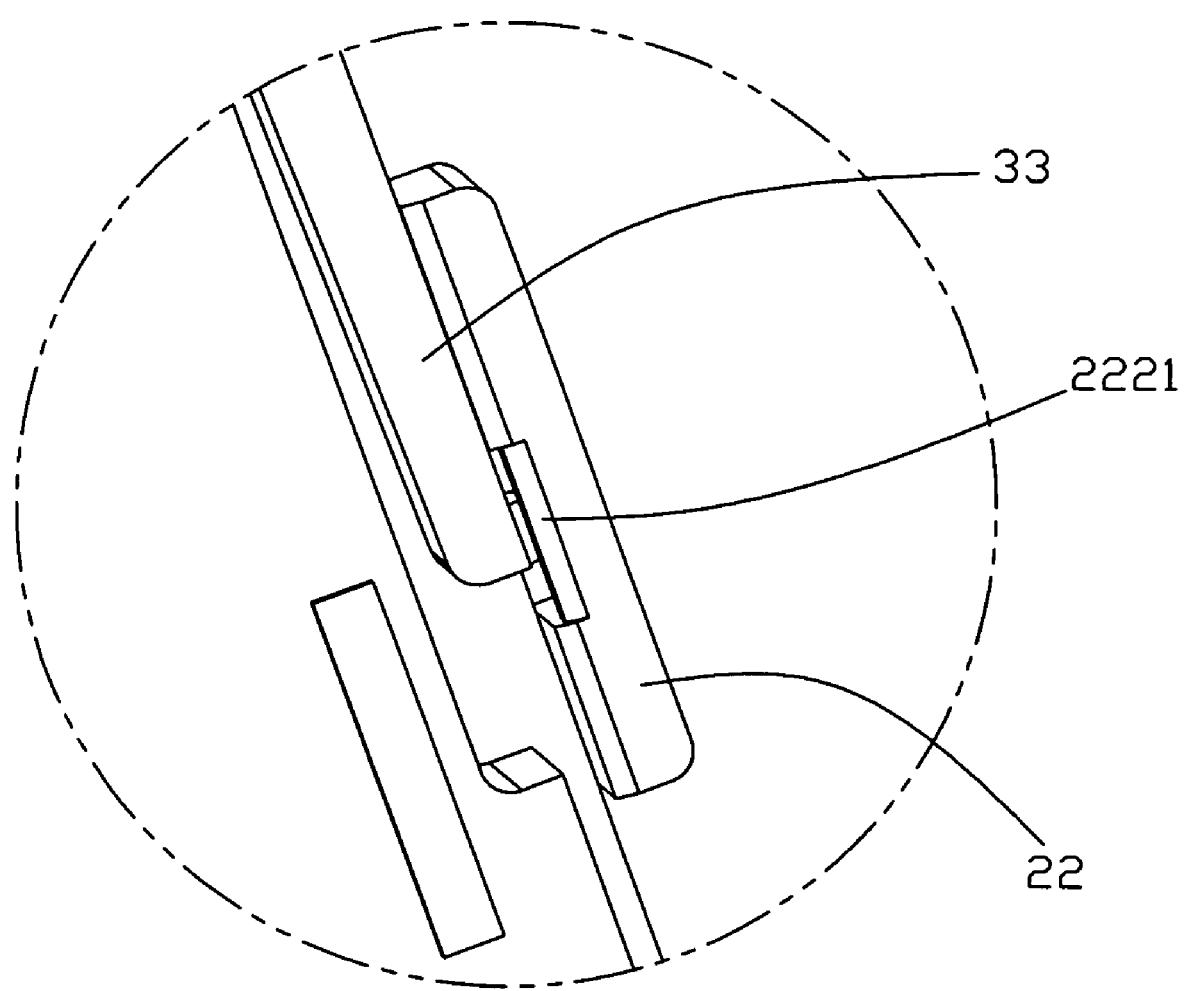
FIG. 6 is an enlarged view of the part labeled B of FIG. 5.

The pick up cap 2 comprises a body portion 21 with a flat suction surface for the vacuum suction device (not shown) and a plurality of retention portions 22 extending downwardly from the periphery of the body portion 21. The body portion 21 is dimensioned to be large enough to fully cover the receiving cavity 311 and comprises a plurality of second protruding members 211 extending downwardly from the body portion 21 engaged with the first protruding members 3221 for positioning the pick up cap 2 on the insulative housing 3 exactly. The retention portion 22 comprises a retention hole 221 and a blocking portion 222. Please referring to FIG. 6, the blocking portion 222 includes a second guiding surface 2221.

Referring to FIGS. 3-6, when assembled, first put the pick up cap 2 on the insulative housing 3, the first protruding members 3221 matched with the second protruding members 221 and the second guiding surface 2221 facing to the first guiding surface 3311, then press the pick up cap 2 down, due to the spring of the spring arm 33, the locking portion 331 enters into the retention hole 221 and interlocks with the blocking portion 222 for securely positioning the pick up cap 2 on the insulative housing 3. The first guiding surface 3311 and the second guiding surface 2221 make it easy to assemble the pick up cap 2 and can protect the locking portion 331.

The spring arm 33 with a locking portion 331 is set on the insulative housing 3 and the retention portion 22 is set on the pick up cap 2, thus the spring arm 33 has a good elasticity and can assure a good retention character.

While preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector assembly comprising:
   an electrical connector for electrically connecting an electronic package with a circuit substrate including an insulative housing and a plurality of contacts received therein, the insulative housing comprising a bottom wall and sidewalls extending upwardly from the bottom wall, the sidewall defining a spring arm extending there along, the spring arm defining a locking portion; and
   a pick up cap attached on the electrical connector and comprising a body portion and a retention portion extending downwardly from the body portion, the retention portion interlocking with the locking portion for securely positioning the pick up cap on the insulative housing.

2. The electrical connector assembly as claimed in claim 1, wherein the retention portion comprises a retention hole and a blocking portion interlocked with the locking portion.

3. The electrical connector assembly as claimed in claim 2, wherein the locking portion comprising a first guiding surface and the blocking portion comprising a second guiding surface corresponding to the first guiding surface.

4. The electrical connector assembly as claimed in claim 1, wherein the sidewall defines a recess, and the spring arm is partly positioned in the recess.

5. The electrical connector assembly as claimed in claim 1, wherein the locking portions are located at two ends of the spring arm.

6. The electrical connector assembly as claimed in claim 5, wherein the spring arm is connected with the sidewall at a middle portion thereof.

7. An electrical connector assembly comprising:
   an insulative housing defining a receiving cavity therein;
   a plurality of contacts disposed in the housing with contacting sections extending into the receiving cavity;
   at least one resilient arm unitarily formed on a periphery of the housing with a laterally extending locking portion thereon;
   a pick up cap positioned upon the housing and including a body portion providing an upper horizontal flat surface thereon, and a blocking portion located on a periphery of the body portion and latched to the locking portion.

8. The electrical connector assembly as claimed in claim 7, wherein said locking portion extends outwardly.

9. The electrical connector assembly as claimed in claim 7, wherein said resilient arm extends essentially along a horizontal direction.

10. The electrical connector assembly as claimed in claim 7, wherein said receiving cavity faces upwardly, the insulative housing defines a number of first protruding members extending into the receiving cavity.

11. The electrical connector assembly as claimed in claim 10, wherein said body portion is dimensioned to be large enough to fully cover the receiving cavity.

12. The electrical connector assembly as claimed in claim 10, wherein a plurality of second protruding members are formed on an undersurface of the body portion to engage with the first protruding members for positioning the pick up cap on the insulative housing exactly.

13. The electrical connector assembly as claimed in claim 7, wherein there are two pairs of said resilient arms located on opposite sides of said periphery of the housing, respectively.

14. The electrical connector assembly as claimed in claim 7, wherein said periphery of the housing defines a recess in which said resilient arm extends so as to protect said resilient arm from being damaged.

15. The electrical connector assembly as claimed in claim 7, wherein said pick up cap defines a stiff retention portion extending downwardly from the body portion and forming said blocking portion thereof and a retention hole to cover and receive said locking portion therein.

* * * * *